(12) United States Patent
Yang et al.

(10) Patent No.: US 7,862,334 B2
(45) Date of Patent: Jan. 4, 2011

(54) HEAT TREATMENT APPARATUS AND HEAT TREATMENT METHOD USING THE SAME

(75) Inventors: Tae-Hoon Yang, Suwon-si (KR); Ki-Yong Lee, Suwon-si (KR); Jin-Wook Seo, Suwon-si (KR); Byoung-Keon Park, Suwon-si (KR)

(73) Assignee: Samsung Mobile Display Co., Ltd. (KR)

( * ) Notice: Subject to any disclaimer, the term of this patent is extended or adjusted under 35 U.S.C. 154(b) by 957 days.

(21) Appl. No.: 11/510,432

(22) Filed: Aug. 24, 2006

(65) Prior Publication Data

US 2007/0049057 A1 Mar. 1, 2007

(30) Foreign Application Priority Data

Aug. 25, 2005 (KR) .............. 10-2005-0078362

(51) Int. Cl.
*F27B 9/00* (2006.01)
(52) U.S. Cl. ............. 432/121; 414/935; 118/729
(58) Field of Classification Search ........... 118/718, 118/715, 724, 725, 729; 219/405, 443.1, 219/444.1, 448.1; 432/121, 143; 438/935, 438/936, 937, 938, 939
See application file for complete search history.

(56) References Cited

U.S. PATENT DOCUMENTS

| | | | | | |
|---|---|---|---|---|---|
| 5,372,646 | A | * | 12/1994 | Foote et al. | 118/719 |
| 5,563,683 | A | * | 10/1996 | Kamiya | 355/53 |
| 5,976,258 | A | * | 11/1999 | Kleiner | 118/718 |
| 6,019,850 | A | * | 2/2000 | Frey | 118/719 |
| 6,187,101 | B1 | * | 2/2001 | Yoshizawa | 118/718 |
| 6,382,964 | B2 | * | 5/2002 | Sakamoto et al. | 432/171 |
| 6,464,792 | B1 | * | 10/2002 | Wengert et al. | 118/715 |
| 6,483,068 | B2 | * | 11/2002 | Jang | 219/390 |
| 6,732,911 | B2 | * | 5/2004 | Matsuki et al. | 228/219 |
| 7,015,436 | B2 | * | 3/2006 | Fila et al. | 219/622 |
| 7,381,990 | B2 | * | 6/2008 | So | 257/69 |
| 2003/0010775 | A1 | * | 1/2003 | Kim | 219/634 |
| 2003/0102297 | A1 | * | 6/2003 | Goenka et al. | 219/400 |
| 2006/0046357 | A1 | * | 3/2006 | Lee et al. | 438/149 |
| 2007/0122936 | A1 | * | 5/2007 | Park et al. | 438/77 |
| 2007/0285870 | A1 | * | 12/2007 | Shim | 361/234 |
| 2008/0196609 | A1 | * | 8/2008 | Spies et al. | 101/142 |

FOREIGN PATENT DOCUMENTS

JP    08-064656    3/1996

(Continued)

OTHER PUBLICATIONS

Korean Notice of Allowability issued May 4, 2007, listing prior art references considered during prosecution.

*Primary Examiner*—Gregory A Wilson
(74) *Attorney, Agent, or Firm*—Knobbe Martens Olson & Bear LLC

(57) ABSTRACT

A heat treatment apparatus and a heat treatment method using the same are disclosed. In the method, a support plate on which a device substrate is mounted is loaded into the heat treatment apparatus using a transfer unit in an in-line manner, and the device substrate mounted on the support plate is heat-treated using the heat treatment apparatus.

17 Claims, 6 Drawing Sheets

FOREIGN PATENT DOCUMENTS

| | | |
|---|---|---|
| JP | 09-106948 | 4/1997 |
| JP | 2004-111617 | 4/2004 |
| JP | 2004-349415 | 12/2004 |
| KR | 10-2000-0020135 A | 4/2000 |
| KR | 10-2001-0077346 | 8/2001 |
| KR | 10-2006-0090111 | 8/2006 |

* cited by examiner

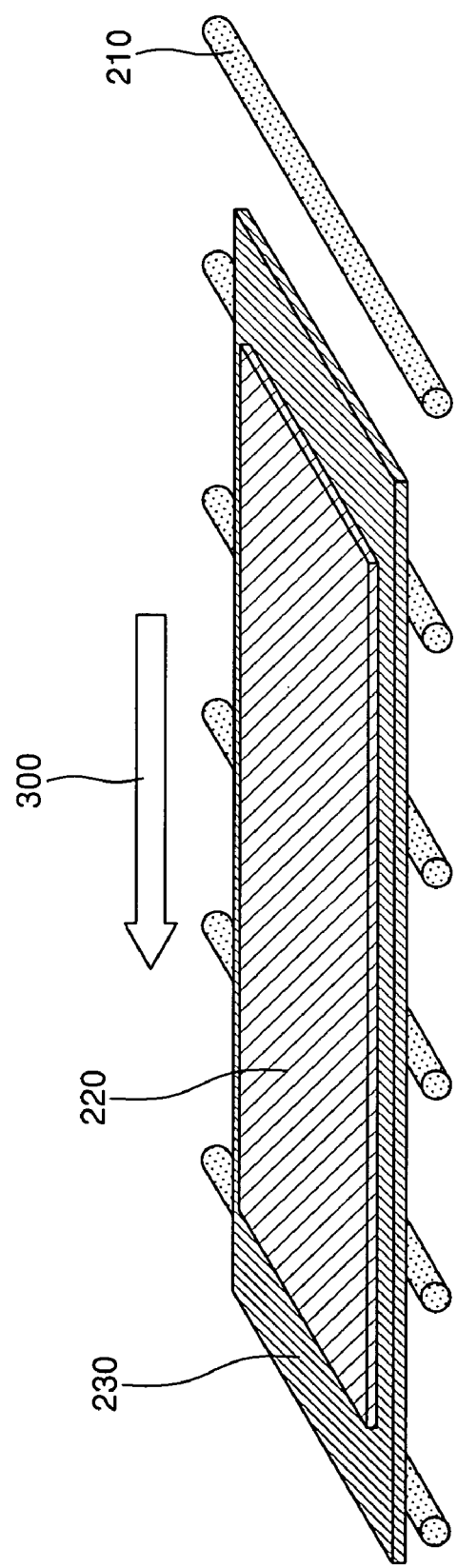

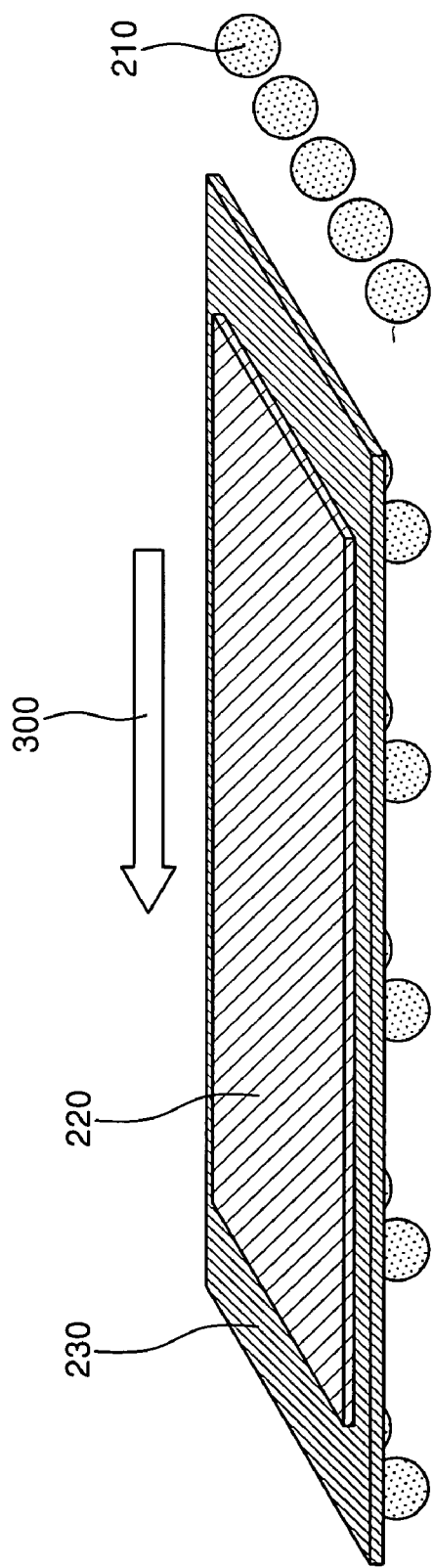

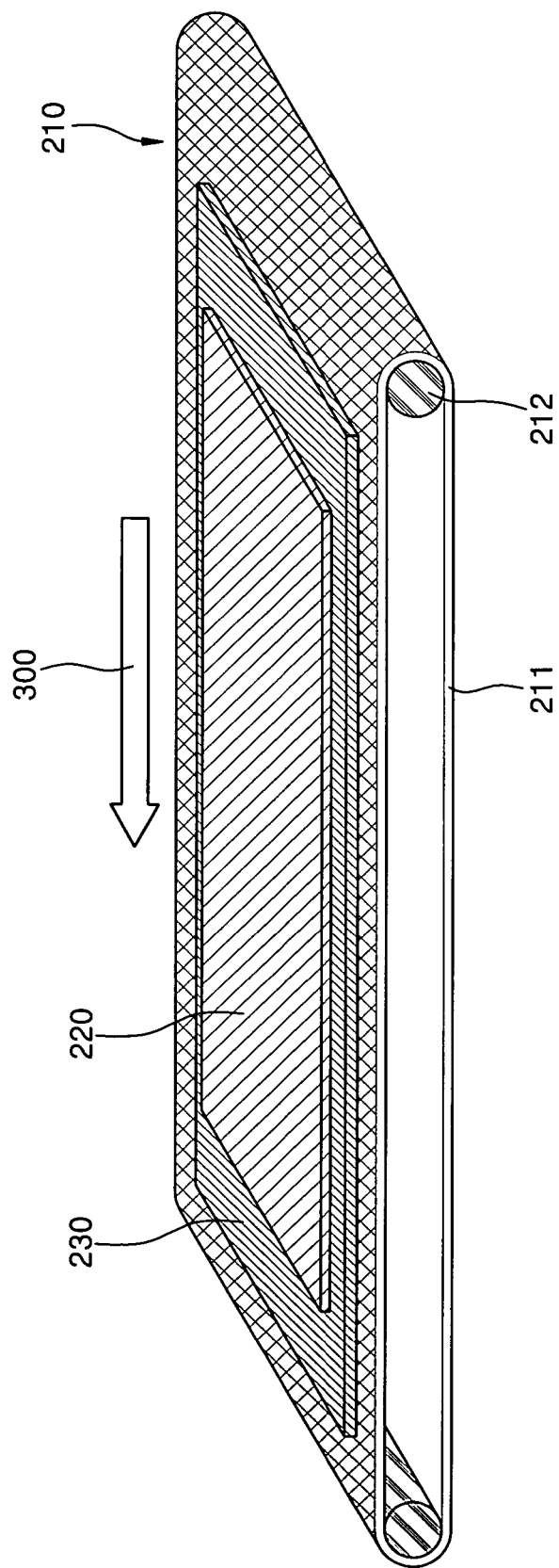

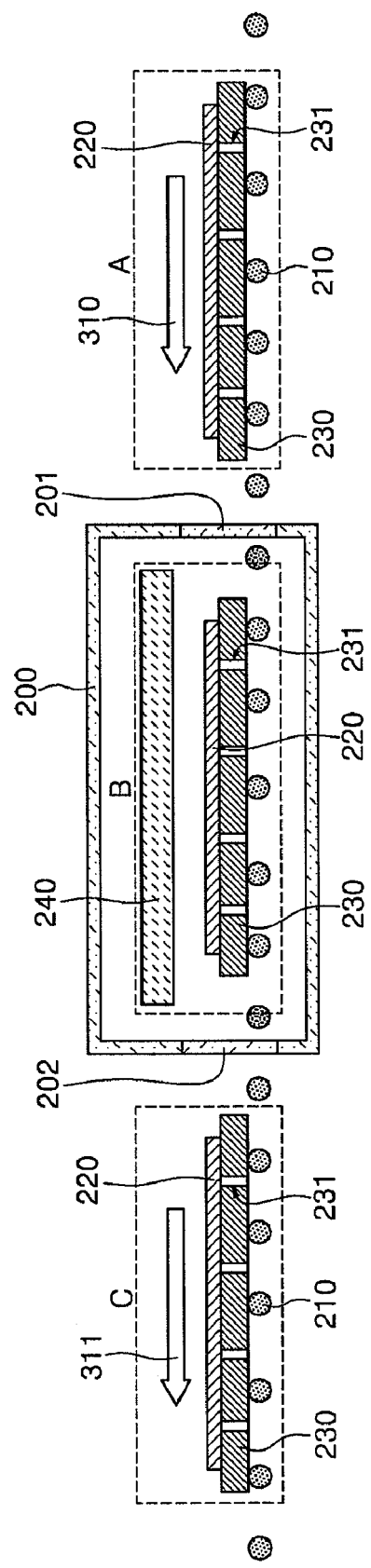

HEAT TREATMENT APPARATUS AND HEAT TREATMENT METHOD USING THE SAME

CROSS-REFERENCE TO RELATED APPLICATION

This application claims the benefit of Korean Patent Application No. 10-2005-0078362, filed on Aug. 25, 2005, the disclosure of which is incorporated herein by reference in its entirety.

BACKGROUND

1. Field

The present disclosure relates to a heat treatment apparatus and a heat treatment method using the same.

2. Description of the Related Technology

A flat panel display (FPD), such as an organic light emitting display device (OLED) or a liquid crystal display device (LCD), employs a thin film transistor (TFT). In general, formation of a TFT includes depositing amorphous silicon (a-Si) on a transparent substrate formed of glass or quartz, dehydrogenating the a-Si, implanting impurity ions to form a channel, and forming a semiconductor layer by crystallizing the a-Si into polycrystalline silicon (poly-Si) using a heat treatment process.

In this case, the semiconductor layer, which constitutes a source, a drain and a channel of the TFT, is formed by depositing an a-Si layer on the transparent substrate, such as a glass substrate, using a chemical vapor deposition (CVD) process.

Thereafter, a crystallization process is carried out. Specifically, the a-Si layer with low electron mobility is heat-treated and crystallized into a poly-Si layer with high electron mobility. Various crystallization methods may apply to the crystallization process. These methods apply energy (i.e., heat) to the a-Si layer to crystallize the a-Si layer into the poly-Si layer.

SUMMARY

One embodiment provides a heat treatment apparatus for processing a device substrate. The apparatus comprises: a chamber comprising an inlet and an outlet; a support plate configured to support a device substrate having a bottom surface, the support plate having an upper surface and a lower surface, the upper surface being configured to contact substantially the entire bottom surface of the device substrate; a transfer unit configured to move the support plate along a path extending in a direction from a first position to a second position through the inlet, the chamber, and the outlet, the first position being outside the chamber adjacent to the inlet, the second position being outside the chamber adjacent to the outlet, the transfer unit being configured to movably contact the lower surface of the support plate; and a heater positioned in the chamber, the heater being configured to heat the device substrate while the device substrate is located in the chamber.

The transfer unit may extend from the first position to the second position. The transfer unit may be in point contacts with the lower surface of the support plate. The transfer unit may comprise a plurality of bearings spaced apart a distance from one another, and the bearings may movably contact the lower surface of the support plate. A value obtained by dividing the distance by a length of the device substrate may be about 0.5 or less. The length may extend in the direction of the path. The plurality of bearings may be arranged in a matrix pattern.

The transfer unit may be in line contacts with the lower surface of the support plate. The transfer unit may comprise a plurality of rollers spaced apart a distance from one another, and the rollers may movably contact the lower surface of the support plate. A value obtained by dividing the distance by a length of the device substrate may be about 0.5 or less. The length may extend in the direction of the path. The plurality of rollers may be arranged substantially perpendicular to the path.

The transfer unit may be in area contact with the lower surface of the support plate. The transfer unit may comprise a conveyor belt having a surface contacting the lower surface of the support plate. The conveyor belt may extend along the path.

The support plate may comprise at least one hole formed in a predetermined region thereof. The support plate may comprise quartz or a metal.

Another embodiment provides a method of heat-treating a device substrate. The method comprises: providing the apparatus described above; placing a device substrate on the support plate at the first position; moving the support plate along the path into the chamber through the inlet; heat-treating the device substrate by activating the heater; and moving the support plate along the path out of the chamber through the outlet; and removing the device substrate from the support plate at the second position.

The device substrate may comprise an amorphous silicon layer formed thereon, and heat-treating the device substrate may comprise crystallizing the amorphous silicon layer into a polycrystalline silicon layer. Crystallizing the amorphous silicon layer may comprise using a super grain silicon (SGS) crystallization process.

Another embodiment provides a display device made by the method described above. The display device may comprise a device substrate having a flatness of about 0.89 mm or less.

Another embodiment provides a heat treatment apparatus and method in which a support plate on which a device substrate is mounted is loaded into the heat treatment apparatus using a transfer unit in an in-line manner and the device substrate is heat-treated using the heat treatment apparatus.

Another embodiment provides a heat treatment apparatus which includes: a transfer unit; a support plate disposed on the transfer unit; a device substrate disposed on one surface of the support plate; and a heating apparatus disposed in a predetermined position corresponding to the device substrate.

Another embodiment provides a heat treatment method which includes: preparing a support plate on which a device substrate is mounted; loading the device substrate and the support plate into a chamber of a heat treatment apparatus using a transfer unit installed both within and without the chamber; heat-treating the device substrate using a heating apparatus of the heat treatment apparatus; and unloading the device substrate and the support plate from the chamber to the transfer unit installed without the chamber using the transfer unit installed within the chamber.

BRIEF DESCRIPTION OF THE DRAWINGS

The above and other features of the instant embodiments will be described in reference to certain exemplary embodiments thereof with reference to the attached drawings in which:

FIGS. 3A through 3C are schematic perspective views of transfer units according to embodiments;

FIG. 4 is a schematic cross-sectional view illustrating a method of operating a heat treatment apparatus according to one embodiment;

DETAILED DESCRIPTION

Figure 1:
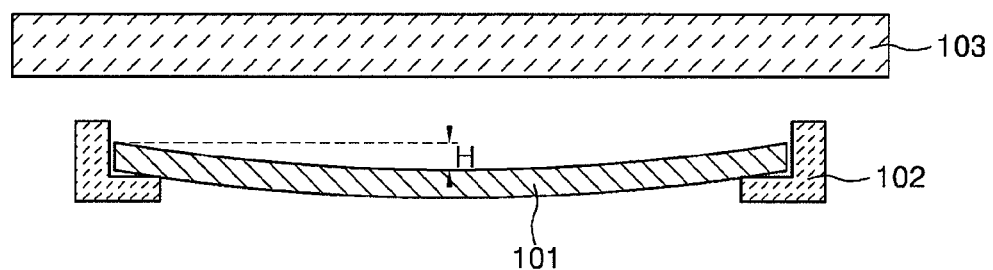
FIG. 1 is a schematic cross-sectional view illustrating a conventional method of crystallizing amorphous silicon using a furnace.

The certain embodiments will now be described with reference to the accompanying drawings. In the drawings, the thicknesses and lengths of layers and regions are exaggerated for clarity. Like reference numerals may be used to denote the same elements throughout the specification.

One approach to the crystallization of a-Si is to load a substrate into a furnace and apply heat to the a-Si layer using a heating apparatus of a furnace. FIG. 1 is a cross-sectional view illustrating a conventional method of crystallizing a-Si using a conventional furnace.

Referring to FIG. 1, the conventional furnace is a batch-type heat treatment apparatus, which may include a substrate 101 to be heated, a support 102 for supporting the substrate 101, and a heating apparatus 103 for heating the substrate 101. When the substrate 101 is loaded into the batch-type furnace, the substrate 101 may be loaded using a robot arm (not shown). The substrate 101 is loaded in the furnace using the robot arm and then is mounted on the support 102.

Subsequently, when an a-Si layer formed on the substrate 101 is heated using the heating apparatus 103, the substrate 101 on which the a-Si layer is formed is also heated and may be subjected to thermal damages. For example, since an FPD, such as an OLED, makes use of a large-sized glass substrate as the substrate 101, the substrate 101 may be bent downward to a predetermined extent "H" due to heat as shown in FIG. 1.

Figure 2:
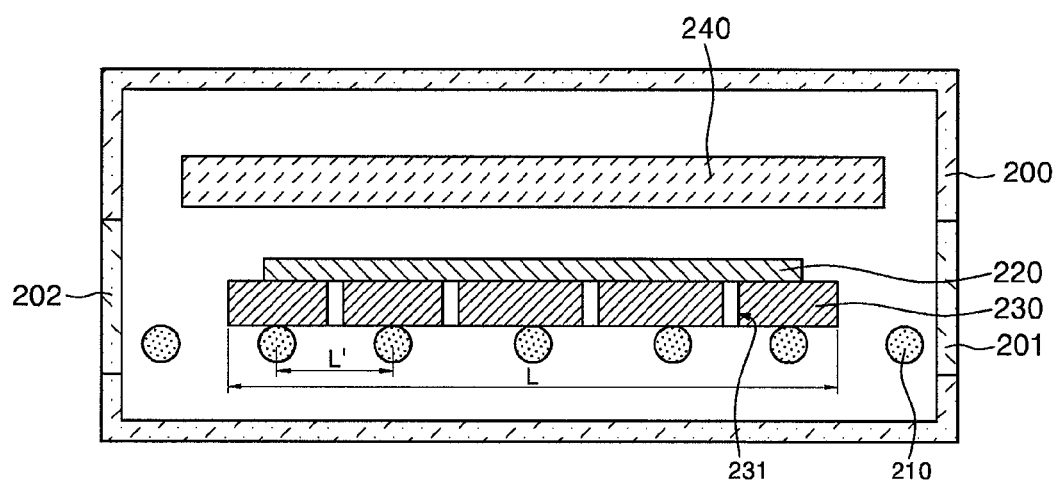
FIG. 2 is a schematic cross-sectional view of a heat treatment apparatus according to an embodiment.

FIG. 2 is a cross-sectional view of a heat treatment apparatus according to an embodiment. Referring to FIG. 2, the heat treatment apparatus includes a plurality of transfer units 210, a support plate 230 for supporting and fixing a device substrate 220, and a heating apparatus 240 which are disposed in a chamber 200. The chamber 200 defines a processing space isolated from the outside.

The term "device substrate," as used herein, refers to a substrate which is part of an electronic device. An exemplary electronic device may be a display device. Examples of the display device include, but are not limited to, an organic light emitting display device (OLED), a liquid crystal display (LCD), a plasma display panel (PDP), and a field emission display device (FED). In such a display device, the device substrate may be formed of glass or quartz. The device substrate may include an array of semiconductor circuits formed thereon. The semiconductor circuits may include thin film transistors, each having a semiconductor layer. The electronic device may also include, but is not limited to, other consumer electronic products, electronic circuits, electronic circuit components, parts of the consumer electronic products, electronic test equipments, etc. Further, the electronic device may include unfinished products.

At least one door may be installed at a sidewall of the chamber 200 such that the device substrate 220 and the support plate 230 may be loaded and unloaded through the door.

As can be seen from FIG. 2, when two doors 201 and 202 are installed at the sidewalls of the chamber 200, one door 201 is used to load the device substrate 220 and the support plate 230 into the chamber 200, and the other door 202 is used to unload the device substrate 220 and the support plate 230 from the chamber 200. In certain embodiments, a vacuum pump (not shown) may be disposed in a predetermined region of the chamber 200 to provide the processing space of the chamber 200 with a vacuum atmosphere.

The transfer units 210 serve to load or transfer the device substrate 220 and the support plate 230 into a crystallization unit. The transfer units 210 may be arranged at a regular interval. Each of the transfer units 210 may have a cylindrical shape as shown in FIG. 3A or a spherical shape as shown in FIG. 3B. Alternatively, the transfer unit 210 may have a belt shape as shown in FIG. 3C.

Referring to FIGS. 3A through 3C, when the device substrate 220 and the support plate 230 move in a predetermined direction 300, the transfer unit 210 comes into line contact, point contact, or area contact with the support plate 230 and conveys the support plate 230. In other words, the transfer unit 210 shown in FIG. 3A functions as a roller. The transfer unit 210 shown in FIG. 3B functions as a bearing. The transfer unit 210 shown in FIG. 3C includes a belt 211 and a rotation axis 212 for rotating the belt 211 and functions as a conveyor belt.

The device substrate 220 may be a transparent insulating substrate, such as a glass substrate. An amorphous silicon (a-Si) layer (not shown) is formed on the device substrate 220. The a-Si layer may be heat-treated using a heat treatment apparatus and crystallized into a polycrystalline silicon (poly-Si) layer.

The support plate 230 may be formed of a material, such as quartz or a metal, which is highly resistant to heat. In one embodiment, the support plate 230 may be formed of a material of which flatness remains unchanged at a heat treatment temperature, i.e., at a temperature of about 750° C. or lower. When the a-Si layer formed on the device substrate 220 is crystallized into the poly-Si layer, a heat treatment process may be performed at a temperature of about 500° C. to about 750° C. for about 2 to about 30 hours. The support plate 230 may be formed of a material which has substantially no deformation in this temperature range.

In one embodiment, the support plate 230 includes a hole 231 in a predetermined shape in a predetermined region. The hole 231 may serve to maintain the device substrate 220 at a generally uniform temperature.

In one embodiment, a length L of the support plate 230 is at least twice an interval L' between the transfer units 210, which are in point contact or line contact with the support plate 230. This configuration permits the support plate 230 to stably operate on the transfer units 210. The support plate 230 may be in line contact with the transfer units 210 as shown in FIG. 3A or in point contact with the transfer units 210 as shown in FIG. 3B. In one embodiment, as shown in FIG. 2, an interval between adjacent contact lines (in FIG. 3A) or adjacent contact points (in FIG. 3B) divided by the length of the device substrate 220 is about 0.5 or less. A skilled artisan will appreciate that the interval between the adjacent contact lines or the adjacent contact points can vary depending on the design of a device.

Here, the term "flatness" refers to a measurement of deformed extent (or height) of the device substrate 220. A flatness is measured by placing the device substrate 220 on a marble plate which has a substantially flat top surface.

The heating apparatus 240 is used to supply energy (i.e., heat) to the device substrate 220. A top surface of the device substrate 220 may be heated up to a temperature of about 750° C. by the heating apparatus 240.

FIG. 4 is a cross-sectional view illustrating a method of driving a heat treatment apparatus according to one embodiment. Referring to FIG. 4, heat treatment of the device substrate 220 using the above-described heat treatment apparatus may include a step A of loading the device substrate 220 into the chamber 200, a step B of heat-treating the device substrate 220, and a step C of transferring the device substrate 220. In one embodiment, the heat treatment process may be continuously performed and the heat treatment apparatus may be connected in series to other apparatuses. Accordingly, the heat treatment process can be performed in an in-line manner.

At step A, the device substrate 220 is mounted on the support plate 230. The device substrate 220 has a layer to be treated. For example, when a heat treatment process is conducted for a crystallization process, the layer is an a-Si layer. In this case, the device substrate 220 may be secured to the support plate 230 by a suitable fixing unit, for example, a vacuum suction unit.

The support plate 230 is movably mounted on the transfer unit 210. The support plate 230 and the device substrate 220 may move into the chamber 200 (see the arrow "310") by the transfer unit 210. In the illustrated embodiment, the door 201 opens before the support plate 230 and the device substrate 220 are loaded into the chamber 200. Subsequently, the door 201 is closed after the support plate 230 and the device substrate 220 are completely loaded in the chamber 200. This configuration isolates an inner space from the outside.

At step B, the device substrate 220 is heat-treated using the heating apparatus 240 that is installed at a predetermined position of the chamber 200. In one embodiment, the device substrate 220 may be a transparent insulating substrate such as a glass substrate. The heat treatment of the device substrate 220 may be performed at a temperature of about 750° C. or lower. At the temperature range, thermal damages to the device substrate 220 may be avoided.

In one embodiment, the heat treatment process is employed to crystallize an a-Si layer into a poly-Si layer. Here, the crystallization process may be one selected from the group consisting of a solid phase crystallization (SPC) method, a metal induced crystallization (MIC) method, a metal induced lateral crystallization (MILC) method, and a super grain silicon (SGS) method.

Specifically, the SPC method may include annealing an a-Si layer at a temperature of about 600° C. or lower for a long period of time. In the MIC and MILC methods, a metal catalyst is deposited on or implanted into an a-Si layer, and the a-Si layer is heat-treated and crystallized into a poly-Si layer using the metal catalyst. Also, the SGS method includes forming a capping layer and a metal catalyst layer on an a-Si layer. Thereafter, the a-Si layer with the capping layer and the metal catalyst layer formed thereon is heat-treated so that a metal catalyst of the metal catalyst layer diffuses through the capping layer to form crystal seeds in the a-Si layer. The a-Si layer is crystallized into a poly-Si layer using the crystal seeds as nuclei.

At step C, the support plate 230 and the device substrate 220 are unloaded from the chamber 200. In this case, after the door 202 opens, the support plate 230 and the device substrate 220 are unloaded from the chamber 200. Subsequently, the door 202 is closed.

At step C, the support plate 230 and the device substrate 220 are transferred using the transfer unit 210. After step C is completed, the support plate 230 and the device substrate 220 are transferred to another apparatus to undergo a subsequent process.

After step C is completed and before the device substrate 220 is transferred to another apparatus, the flatness of the device substrate 220 may be measured. Thus, when the flatness of the device substrate 220 is within a predetermined range, the subsequent process is carried out. However, when the flatness of the device substrate 220 falls out of the predetermined range, it is determined that the device substrate 220 is defective, and thus no further process is carried out.

In the illustrated embodiment, the transfer unit 210 is continually arranged both inside and outside the chamber 200 so that the device substrate 220 and the support plate 230 can sequentially move in steps A through C. A skilled artisan will appreciate that various arrangements may be made for transporting the device substrate 220.

Figure 5A:
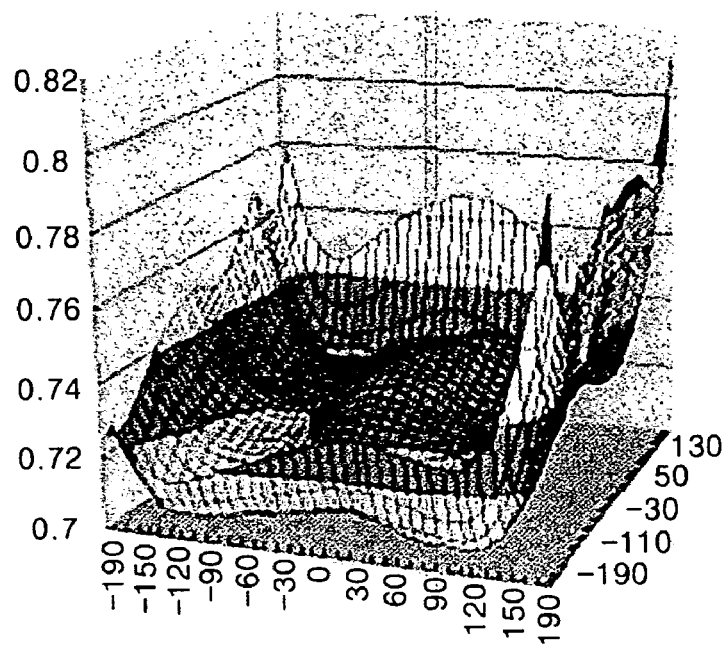
FIG. 5A is a graph of measurements of flatness of a device substrate that is heat-treated using a heat treatment apparatus according to an embodiment.
Figure 5B:
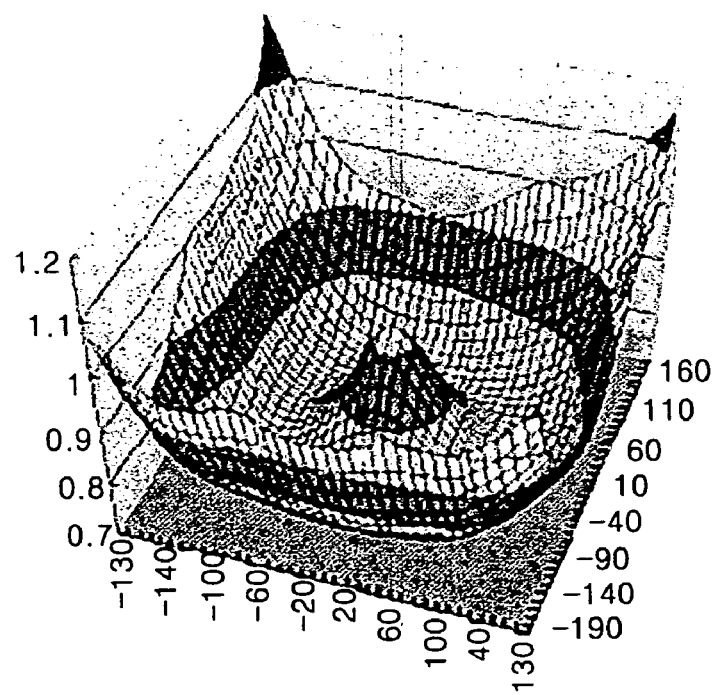
FIG. 5B is a graph of measurements of flatness of a device substrate that is heat-treated with a conventional heat treatment apparatus.

FIG. 5A is a graph of measurements of flatness of a device substrate that is heat-treated using a heat treatment apparatus according to an embodiment, and FIG. 5B is a graph of measurements of flatness of a device substrate that is heat-treated using a conventional heat treatment apparatus. Here, FIGS. 5A and 5B graphically represent 3-dimensional values that are obtained by measuring the height of a top surface of the device substrate at 300 points or more on the assumption that a top surface of the support plate is at the level of 0. In FIGS. 5A and 5B, an X-axis and a Y-axis denote coordinates of the device substrate, and a Z-axis denotes the height of the surface of the device substrate. Thus, actual flatness of the device substrate is obtained by subtracting the thickness of the device substrate from a value on the Y-axis. In FIGS. 5A and 5B, the device substrate with a thickness of 0.7 mm was used to measure the flatness of the device substrate.

Also, in both cases, the device substrate was heat-treated at a temperature of 700° C. for about 10 to about 15 hours.

Referring to FIG. 5A, when the device substrate was heat-treated using the heat treatment apparatus according to the embodiment, it can be seen that the flatness of the device substrate was 0.81 mm or less (here, the actual flatness of the device substrate that is obtained by subtracting the thickness of the device substrate from the value on the Y-axis was 0.21 mm or less). Referring to FIG. 5B, when the device substrate was heat-treated using the conventional heat treatment apparatus, it can be seen that the flatness of the device substrate was 1.20 mm or less (here, the actual flatness of the device substrate that is obtained by subtracting the thickness of the device substrate from the value on the Y-axis was 0.50 mm or less). Accordingly, the device substrate was substantially deformed.

In general, when the flatness of the device substrate is about 0.89 mm or more, the device substrate cannot undergo further processes. In FIGS. 5A and 5B, since the thickness of the device substrate is about 0.7 mm, an actual deformed extent of the device substrate becomes about 0.19 mm or more. Accordingly, as the device substrate is substantially deformed, it cannot undergo a subsequent process. When the device substrate is extremely deformed, the device substrate can be neither fixed nor aligned in another apparatus, and therefore other processes cannot be performed.

Therefore, as shown in FIG. 5A, when the device substrate was heat-treated using the heat treatment apparatus according to the embodiment, the device substrate had a flatness of about 0.81 mm or less so that the device substrate can undergo a subsequent process. However, as shown in FIG. 5B, when the device substrate was heat-treated, using the conventional heat treatment apparatus, the device substrate had a flatness of about 1.20 mm or less. Thus, due to the severe deformation of the device substrate, no further process can be carried out and the device substrate should be discarded.

Furthermore, when the device substrate is heat-treated using the heat treatment apparatus according to the embodiments, since the device substrate is not severely deformed, a subsequent process can be directly performed. However, when the device substrate is heat-treated with the conventional heat treatment apparatus, it is troublesome that the flatness of the device substrate may need to be measured every time. Only when the flatness of the device substrate is about 0.81 mm or less, the device substrate may undergo a subsequent process.

According to the embodiments as described above, a device substrate is mounted on a support plate and heat-treated in an in-line manner, so that the bending of the device substrate can be prevented by the support plate and the in-line manner can simplify the heat treatment process.

Although the invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A heat treatment apparatus for processing a device substrate, comprising:
    a chamber comprising an inlet and an outlet;
    a support plate configured to support a device substrate having a bottom surface, the support plate having a flat upper surface and a lower surface, the upper surface being configured to contact substantially the entire bottom surface of the device substrate, wherein the support plate comprises quartz or a metal;
    a transfer unit configured to move the support plate along a path extending in a direction from a first position to a second position through the inlet, the chamber, and the outlet, the first position being outside the chamber adjacent to the inlet, the second position being outside the chamber adjacent to the outlet, the transfer unit being configured to movably contact the lower surface of the support plate; and
    a heater positioned in the chamber, the heater being configured to heat the device substrate while the device substrate is located in the chamber,
    wherein the support plate comprises at least one hole formed in a predetermined region thereof, and
    wherein the heater is positioned over the device substrate while the device substrate is located in the chamber.

2. The apparatus of claim 1, wherein the transfer unit is in point contacts with the lower surface of the support plate.

3. The apparatus of claim 2, wherein the transfer unit comprises a plurality of bearings spaced apart a distance from one another, and wherein the bearings movably contact the lower surface of the support plate.

4. The apparatus of claim 3, wherein the support plate comprises a length at least twice the distance, and the length extends along the direction of the path.

5. The apparatus of claim 3, wherein the plurality of bearings are arranged in a matrix pattern.

6. The apparatus of claim 1, wherein the transfer unit is in line contacts with the lower surface of the support plate.

7. The apparatus of claim 6, wherein the transfer unit comprises a plurality of rollers spaced apart a distance from one another, and wherein the rollers movably contact the lower surface of the support plate.

8. The apparatus of claim 7, wherein the support plate comprises a length at least twice the distance, and the length extends along the direction of the path.

9. The apparatus of claim 7, wherein the plurality of rollers are arranged substantially perpendicular to the path.

10. The apparatus of claim 1, wherein the transfer unit is in area contact with the lower surface of the support plate.

11. The apparatus of claim 10, wherein the transfer unit comprises a conveyor belt having a surface contacting the lower surface of the support plate.

12. The apparatus of claim 11, wherein the conveyor belt extends along the path.

13. A method of heat-treating a device substrate, the method comprising:
    providing the apparatus of claim 1;
    placing a device substrate on the support plate at the first position;
    moving the support plate along the path into the chamber through the inlet;
    heat-treating the device substrate by activating the heater; and
    moving the support plate along the path out of the chamber through the outlet; and
    removing the device substrate from the support plate at the second position.

14. The method of claim 13, wherein the device substrate comprises an amorphous silicon layer formed thereon, and wherein heat-treating the device substrate comprises crystallizing the amorphous silicon layer into a polycrystalline silicon layer.

15. The apparatus of claim 14, wherein crystallizing the amorphous silicon layer comprises using a super grain silicon (SGS) crystallization process.

16. A display device made by the method of claim 13.

17. The display device of claim 16, wherein the display device comprises a device substrate having a flatness of about 0.89 mm or less.

* * * * *